US011618337B1

(12) United States Patent
Palombini

(10) Patent No.: US 11,618,337 B1
(45) Date of Patent: Apr. 4, 2023

(54) METHODS AND SYSTEMS FOR MANAGING CHARGERS FOR ELECTRICAL VERTICAL TAKEOFF AND LANDING AIRCRAFTS

(71) Applicant: BETA AIR, LLC, South Burlington, VT (US)

(72) Inventor: John Charles Palombini, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/852,331

(22) Filed: Jun. 28, 2022

(51) Int. Cl.
*B60L 53/66* (2019.01)
*B60L 53/30* (2019.01)
*G01R 31/367* (2019.01)
*B60L 53/67* (2019.01)

(52) U.S. Cl.
CPC .............. *B60L 53/66* (2019.02); *B60L 53/305* (2019.02); *B60L 53/67* (2019.02); *G01R 31/367* (2019.01)

(58) Field of Classification Search
CPC ....................................................... B60L 53/66
USPC ............................................................ 320/125
See application file for complete search history.

(56) References Cited

U.S. PATENT DOCUMENTS

| | | | |
|---|---|---|---|
| 2011/0140656 A1* | 6/2011 | Starr | B60L 53/18 320/109 |
| 2013/0179061 A1* | 7/2013 | Gadh | B60L 53/63 701/1 |
| 2015/0237659 A1* | 8/2015 | Schena | B60L 50/15 370/329 |
| 2017/0092138 A1* | 3/2017 | Trundle | G08B 25/14 |
| 2017/0323235 A1* | 11/2017 | Johnston | H04W 4/00 |
| 2019/0184842 A1* | 6/2019 | Waters | B60L 53/12 |
| 2020/0007384 A1* | 1/2020 | Mueck | H04W 12/06 |
| 2020/0379049 A1* | 12/2020 | Gray | G01R 31/367 |
| 2021/0221247 A1* | 7/2021 | Daniel | B60L 53/68 |
| 2022/0206078 A1* | 6/2022 | Lee | G01R 31/3842 |
| 2022/0294027 A1* | 9/2022 | Choudhary | H02J 7/00036 |

* cited by examiner

*Primary Examiner* — Jerry D Robbins
(74) *Attorney, Agent, or Firm* — Caldwell Intellectual Property Law

(57) ABSTRACT

A system for charger management for electrical vertical takeoff and landing aircrafts includes a sensor connected to the first charger. The sensor is configured to detect a battery metric and transmit the metric to a computing device. The computing device is connected to a mesh network. The mesh network contains many aircrafts connected to chargers. The charger management system manages the charging of the aircraft.

20 Claims, 6 Drawing Sheets

METHODS AND SYSTEMS FOR MANAGING CHARGERS FOR ELECTRICAL VERTICAL TAKEOFF AND LANDING AIRCRAFTS

FIELD OF THE INVENTION

The present invention generally relates to the field of electrical vehicles. In particular, the present invention is directed to methods and systems for managing chargers for electrical vertical takeoff and landing aircrafts.

BACKGROUND

The burgeoning of electric vertical take-off and landing (eVTOL) aircraft technologies promises an unprecedented forward leap in energy efficiency, cost savings, and the potential of future autonomous and unmanned aircraft. However, the technology of eVTOL aircraft is still lacking in crucial areas of charger management.

SUMMARY OF THE DISCLOSURE

In an aspect of the present disclosure, a system for charger management for electrical vertical takeoff and landing aircrafts includes a first battery charger, at least a sensor incorporated with the first charger, at least a sensor incorporated with the first charger, the at least a sensor configured to detect at least a battery metric, a computing device communicatively connected to the first battery charger and a mesh network including at least a second battery charger, the computing device configured to receive the at least a battery metric from the at least a sensor, and transmit the at least a battery metric to the mesh network, wherein the at least a battery metric includes charger status.

In another aspect of the present disclosure, a method for managing chargers for electric vertical takeoff and landing aircrafts, the method includes detecting, by at least a sensor, at least a battery metric; transmitting, by at least a sensor, at least a battery metric to the computing device; receiving, by a computing device, the at least a battery metric from the at least a sensor; and transmitting, by a computing device, at least a battery metric to the mesh network of communicatively connected chargers.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for charger management for electrical vertical takeoff and landing aircrafts. In an embodiment, a system for charger management may include one or more chargers communicatively connected to a computing device. The computing device may be connected to a mesh network which includes at least a second computing device connected to a second charger. The charger management system is configured to detect a battery metric to ensure the charger is operating properly while charging the electric aircraft.

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Figure 1:
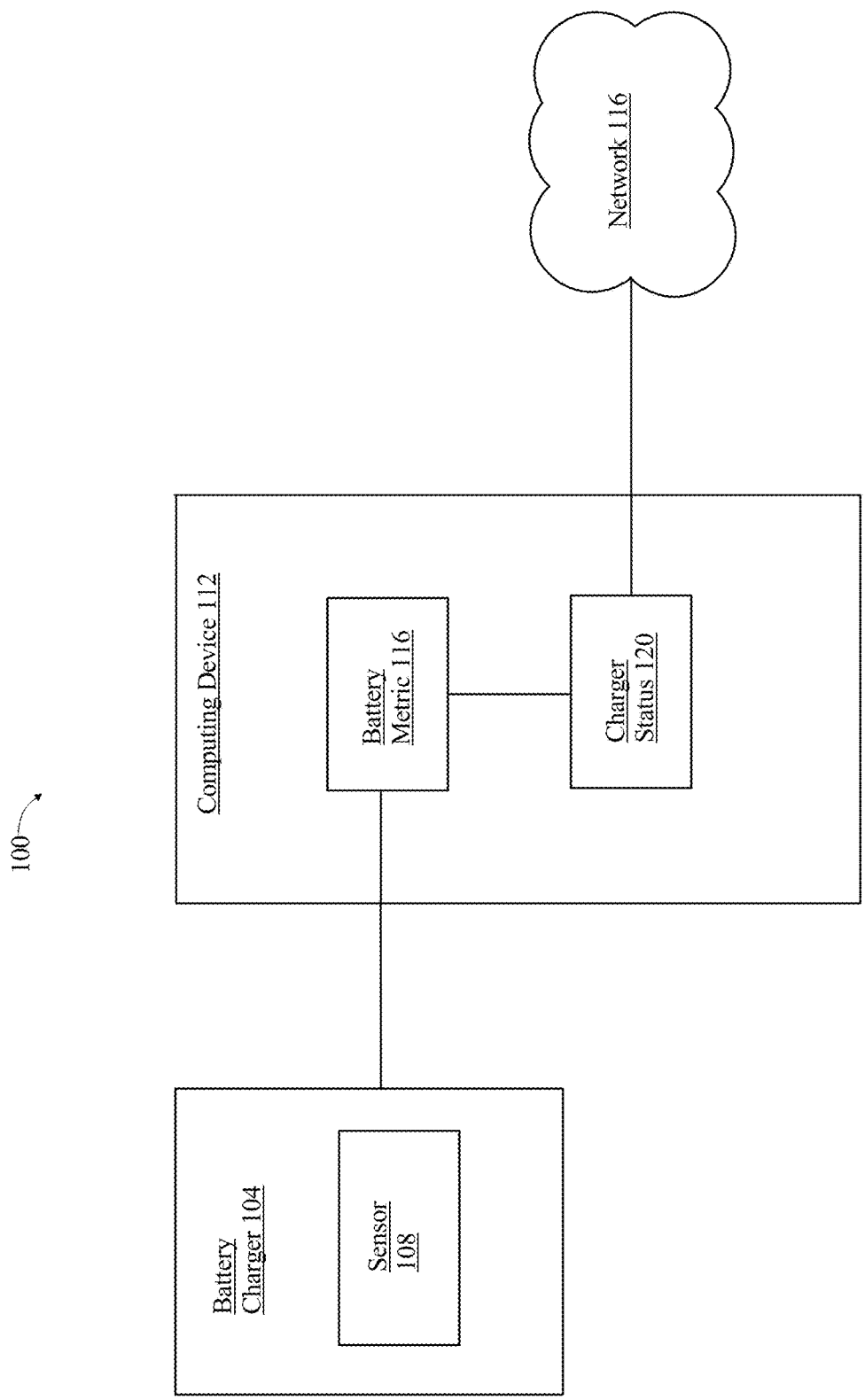
FIG. 1 is a block diagram of a charger management system.

Referring now to FIG. 1, an exemplary embodiment of a system 100 for managing chargers for electrical vertical takeoff and landing aircrafts is illustrated. Charger management system 100 includes charger 104, sensor 108, computing device 112, and network 116, or any combination thereof. As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 1, the system 100 is comprised of a first battery charger 104 and at least a second battery charger 104. As used herein, a "battery charger" is any device capable of delivering power to an energy source. battery charger 104 may include a recharging station. In some embodiments, battery charger 104 may include a charging connector. battery charger 104 may be configured to supply power to the electric aircraft. In some embodiments, battery charger 104 may be configured to deliver a voltage and/or current to the electric aircraft. In some embodiments, battery charger 104 may be configured to deliver 240V to the electric aircraft. In some embodiments, battery charger 104 may be configured to deliver 50 A to electric aircraft. In some embodiments, battery charger 104 may include power supply circuitry. Power supply circuitry may include a plurality of electrical components, such as, but not limited to, resistors, capacitors, inductors, transistors, transformers, integrated circuit chips, and the like. In some embodiments, the battery charger may be a fast charger, smart charger, trickle charger, etc., or any combination of the like. A "fast charger," for the purposes of this disclosure, is a charger that allows a battery to be charged in a fraction of the time it takes to do it the standard way, using a three-prong, 220 Volt (V) plug. Fast charging can be achieved by boosting the amperage or varying the voltage in order to increase the amount of potential energy. "Trickle charger" for the purposes of this disclosure, refer to the charger that uses the process of charging a fully charged battery at a rate equal to its self-discharge rate, thus enabling the battery to remain at its fully charged level. In a non-limiting embodiment, the state of fully charged occurs almost exclusively when the battery is not loaded, as trickle charging will not keep a battery charged if current is being drawn by a load, which may include, but not limited to, a battery of an electric aircraft, supplemental storage unit of an electric grid, and the like. The charger 104 may also include bidirectional charging capabilities. "Bidirectional charging," for the purposes of this disclosure, is a process whereby a charger is used to supply power from an electric aircraft's battery or an electric vehicle recharging component's battery to an energy source at a charger and/or to an electric grid; this may be performed via a direct current (DC) to alternating current (AC) converter system embedded in the electric vehicle recharging component and/or in the charger. As used herein, "energy source" is configured to power at least a portion of an electric vehicle and can include, without limitation, a cell. Energy source may include, without limitation, a generator, a photovoltaic device, a battery cell, a fuel cell such as a hydrogen fuel cell, direct methanol fuel cell, and/or solid oxide fuel cell, or an electric energy storage device; electric energy storage device may include without limitation a capacitor and/or a battery. A person of skill in the art will appreciate that energy source may be designed as to meet the energy or power requirement of various electric vehicles. A person of ordinary skill in the art will further appreciate that energy source can be designed to fit within a designated footprint on the various electric aircrafts.

Still referring to FIG. 1, the system 100 is comprised of at least a sensor 108 incorporated with the first charger 104. Sensor 108 may be integrated into a module monitor unit within the battery pack of an electrical aircraft. Sensor 108 may also be integrated into the charger 104 on the charger management system 100. As used in this disclosure, a "sensor" is a device, module, and/or subsystem, utilizing any hardware, software, and/or any combination thereof to sense a characteristic, a phenomenon, and/or changes thereof, in an instant environment; sensor may convert sensed phenomena into electrical signals. Sensor 108 is configured to detect a battery metric. As used in this disclosure, "battery metric" is a measurement detected by a sensor. A battery metric includes, but is not limited to, an electrical parameter and a battery health parameter of a battery used as an energy source in first charger and/or second charger, and/or of a battery of a vehicle being charged thereby. As used in this disclosure, an "electrical parameter" is a measurable electrical value or phenomenon that characterize the behavior of electronic circuits, components, or semiconductors. Electrical parameters may include, without limitation, state of charge, potential, current, and/or impedance of the energy source. State of charge (SOC) is the level of power stored within the energy source. As used in this disclosure, a "battery health parameter" is a measurable value that characterizes state of health of an energy source.

A battery health metric includes one or more elements of data that relates to the state of health (SoH) of the energy source. For the purposes of this disclosure, "state of health" is a figure of merit of the condition of a battery (or a cell, or a battery pack), compared to its ideal conditions. The units of SoH are percent points (100%=the battery's conditions match the battery's specifications). Typically, a battery's SoH will be 100% at the time of manufacture and will decrease over time and use. However, a battery's performance at the time of manufacture may not meet its specifications, in which case its initial SoH will be less than 100%. In exemplary embodiments, one or more elements of system 100 including but not limited to computing device 112 may evaluate state of health of the portion of battery corresponding to health datum. Health datum may be compared to a threshold health datum corresponding to the parameter detected to generate said health datum. Health datum may be utilized to determine, by computing device 112, the suitability of battery module to a given application, such as aircraft flight envelope, mission, cargo capacity, speed, maneuvers, or the like. Health datum may include a useful life estimate corresponding to the at least a battery module. For the purposes of this disclosure, a "useful life estimate" is one or more elements of data indicating a remaining usability of one or more elements of an energy storage device, wherein the usability is a function of whether or not the one or more energy storage elements may be used in performing their designed functions. Useful life estimate may include one or more elements of data related to the remaining use of the battery module. Useful life estimate may include a time limit, usage limit, amperage per time parameter, electric parameter, internal resistance, impedance, conductance, capacity, voltage, self-discharge, ability to accept a charge, number of charge-discharge cycles, age of battery, temperature of battery during previous uses, current or future temperature limitations, total energy charged, total energy discharge, or predictions of failures corresponding to the battery module.

In one or more embodiments, battery health parameter comprises of at least cell failure detection in any battery being sensed, monitored, charged, and/or discharged. In this case, the sensor 108 may be configured to detect gas that may be emitted during or after cell failure. "Cell failure," for the purposes of this disclosure, refers to a malfunction of a battery cell, which may be an electrochemical cell, which renders the cell inoperable for its designed function, namely providing electrical energy to at least a portion of an electric aircraft. Byproducts of cell failure may include gaseous discharge including oxygen, hydrogen, carbon dioxide, methane, carbon monoxide, a combination thereof, or another undisclosed gas, alone or in combination. Further the sensor 108 configured to detect vent gas from electrochemical cells may include a gas detector. For the purposes of this disclosure, a "gas detector" is a device used to detect a gas is present in an area. Gas detectors, and more specifically, the gas sensor that may be used in sensor 108, may be configured to detect combustible, flammable, toxic, oxygen depleted, a combination thereof, or another type of gas alone or in combination. The gas sensor that may be present in sensor 108 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor 108 may include sensors that are configured to detect non-gaseous byproducts of cell failure including, in non-limiting examples, liquid chemical leaks including aqueous alkaline solution, ionomer, molten phosphoric acid, liquid electrolytes with redox shuttle and ionomer, and salt water, among others. Sensor 108 may include sensors that are configured to detect non-gaseous byproducts of cell failure including, in non-limiting examples, electrical anomalies as detected by any of the previous disclosed sensors or components.

With continued reference to FIG. 1, the at least a sensor 108 comprises a sensor suite. The sensor suite is configured to capture a plurality of data. For example, in a non-limiting embodiment, sensor suite may include a plurality of voltmeters, temperature sensors, and the like. Temperature sensors may include, thermocouples, thermistors, thermometers, infrared sensors, resistance temperature sensors, etc.

Figure 2:
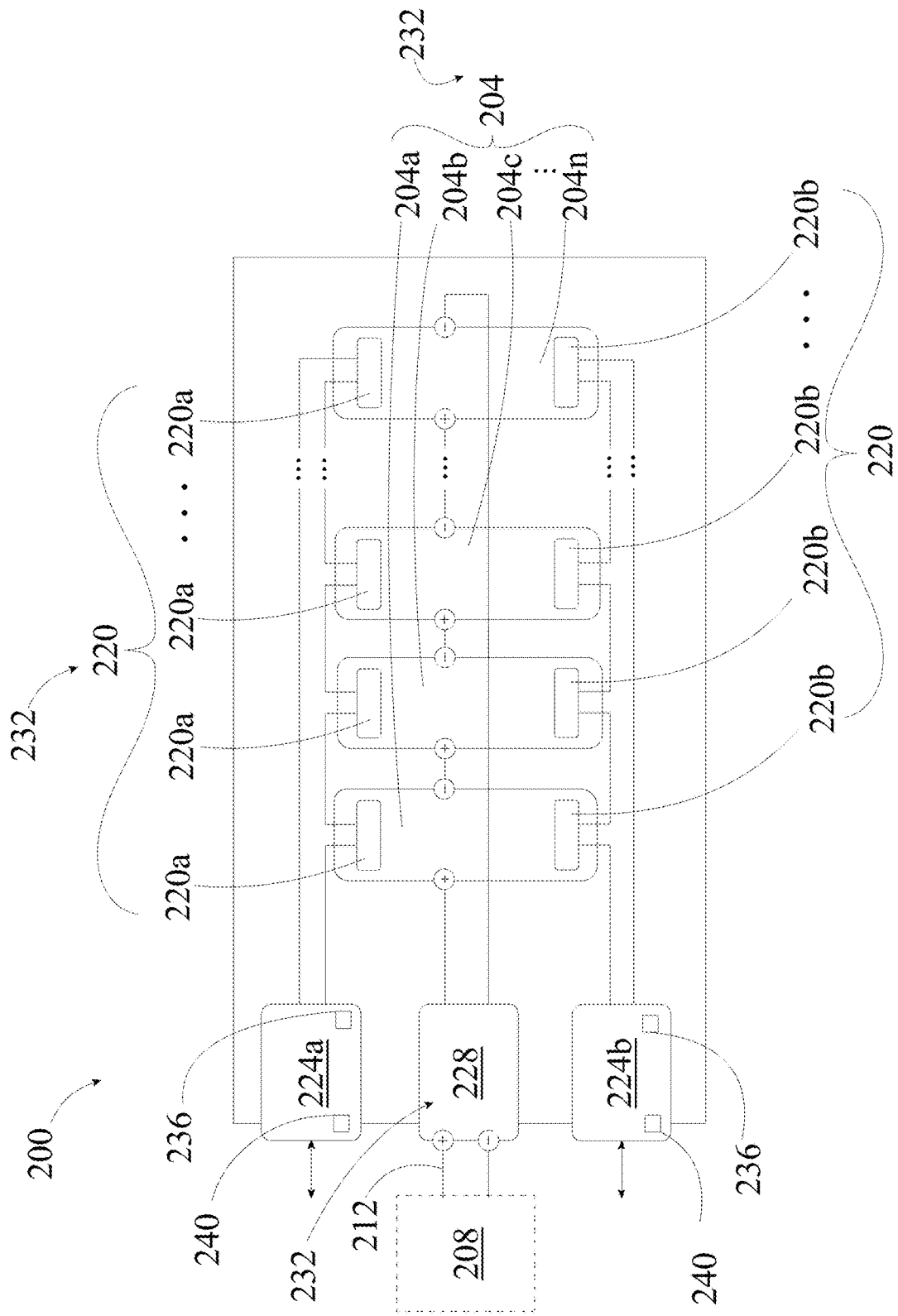
FIG. 2 is an exemplary model of a battery pack.

Now referring to FIG. 2, an exemplary embodiment of a battery pack 200. Battery pack 200 includes a battery module 204, which is configured to provide energy to an electric aircraft 208 via a power supply connection 212. For the purposes of this disclosure, a "power supply connection" is an electrical and/or physical communication between a battery module 204 and electric aircraft 208 that powers electric aircraft 208 and/or electric aircraft subsystems for operation. In one or more embodiments, battery pack 200 may include a plurality of battery modules, such as modules 204a-n. For example, and without limitation, battery pack 200 may include fourteen battery modules. In one or more embodiments, each battery module 204a-n may include a battery cell. For example, and without limitation, battery module 104 may include a plurality of battery cells.

Still referring to FIG. 2, battery pack 200 includes a battery management component 232 (also referred to herein as a "management component"). In one or more embodiments, battery management component 232 may be integrated into battery pack 200 in a portion of battery pack 200 or a subassembly thereof. The battery management component may communicate with the computing device 112 in the charger management system 100. One of ordinary skill in the art will appreciate that there are various areas in and on a battery pack and/or subassemblies thereof that may include battery management component 232. In one or more embodiments, battery management component 232 may be disposed directly over, adjacent to, facing, and/or near a battery module and specifically at least a portion of a battery cell.

Still referring to FIG. 2, battery management component 232 includes a module monitor unit (MMU) 220, a pack monitoring unit (PMU) 224, and a high voltage disconnect 228. In one or more embodiments, battery management component 232 may also include a sensor. For example, and without limitation, battery management component 232 may include a sensor suite having a plurality of sensors. In one or more embodiments, battery management component 232 includes MMU 220, which is mechanically connected and communicatively connected to battery module 204. As used herein, "communicatively connected" is a process whereby one device, component, or circuit can receive data from and/or transmit data to another device, component, or circuit. In an embodiment, communicative connecting includes electrically connecting at least an output of one device, component, or circuit to at least an input of another device, component, or circuit. In one or more embodiments, MMU 220 is configured to detect a condition parameter of battery module 204 of battery pack 200. For the purposes of this disclosure, a "condition parameter" is detected electrical or physical input and/or phenomenon related to a state of a battery pack. A state of a battery pack may include detectable information related to, for example, a temperature, a moisture level, a humidity, a voltage, a current, vent gas, vibrations, chemical content, or other measurable characteristics of battery pack 200 or components thereof, such as battery module 204 and/or battery cell. For example, and without limitation, MMU 220 may detect and/or measure a condition parameter, such as a temperature, of battery module 204. In one or more embodiments, a condition state of battery pack 200 may include a condition state of a battery module 204 and/or battery cell. In one or more embodiments, MMU 220 may include a sensor, which may be configured to detect and/or measure condition parameter. Additional disclosure related to a pack monitoring system can be found in U.S. patent application Ser. No. 17/529,447 entitled "MODULE MONITOR UNIT FOR AN ELECTRIC AIRCRAFT BATTERY PACK AND METHODS OF USE", entirety of which in incorporated herein by reference.

In one or more embodiments, MMU 220 is configured to transmit a measurement datum of battery module 204. MMU 220 may generate an output signal that includes a sensor output signal, such as a measurement datum, which includes information regarding detected condition parameter. For the purposes of this disclosure, "measurement datum" is an electronic signal representing information and/or datum of a detected electrical or physical characteristic and/or phenomenon correlated with a condition state of a battery pack. For example, measurement datum may include data of a condition parameter regarding a detected temperature of a battery cell. In one or more embodiments, measurement datum may be transmitted by MMU 220 to PMU 224 so that PMU 224 may receive measurement datum, as discussed further in this disclosure. For example, MMU 220 may transmit measurement data to a controller 236 of PMU 224.

In one or more embodiments, MMU 220 may include a plurality of MMUs. For instance, and without limitation, each battery module 204a-n may include one or more MMUs 220. For example, and without limitation, each battery module 204a-n may include two MMUs 220a,b. MMUs 220a,b may be positioned on opposing sides of battery module 204. Battery module 204 may include a plurality of MMUs to create redundancy so that, if one MMU fails or malfunctions, another MMU may still operate properly and continue to monitor corresponding battery module 204. In one or more non-limiting exemplary embodiments, MMU 220 may include mature technology so that there is a low risk. Furthermore, MMU 220 may not include software to, for example, increase reliability and durability of MMU 220 and thus, avoid complications often inherent with using software applications. MMU 220 is configured to monitor and balance all battery cell groups of battery pack 200 during charging of battery pack 200. For instance, and without limitation, MMU 220 may monitor a temperature of battery module 204 and/or a battery cell of battery module 204. For example, and without limitation, MMU 220 may monitor a battery cell group temperature. In another example, and without limitation, MMU 220 may monitor a terminal temperature of battery module 204 to, for example, detect a poor high voltage (HV) electrical connection. In one or more embodiments, an MMU 220 may be indirectly connected to PMU 224. In other embodiments, MMU 220 may be directly connected to PMU 224. In one or more embodiments, MMU 220 may be communicatively connected to an adjacent MMU 220.

Still referring to FIG. 2, battery management component 232 includes PMU 224, which is communicatively connected to MMU 220. In one or more embodiments, PMU 224 includes controller 236, which is configured to receive measurement datum from MMU 220. For example, PMU 224a may receive a plurality of measurement data associated with various states of a battery module 204 from MMU 220a. Similarly, PMU 224b may receive a plurality of measurement data from MMU 220b. In one or more embodiments, PMU 224 may receive measurement datum from MMU 220 via communication component, such as via communicative connections. For example, PMU 224 may receive measurement datum from MMU 220 via an isoSPI transceiver. In one or more embodiments, controller 236 of PMU 224 is configured to identify an operating condition of battery module 204 as a function of measurement datum. For the purposes of this disclosure, an "operating condition" is a state and/or working order of battery pack 200 and/or any components thereof. For example, and without limitation, an operating condition may include a state of charge (SOC), a depth of discharge (DOD), a temperature reading, a moisture/humidity level, a gas level, a chemical level, or the like. In one or more embodiments, controller 236 of PMU 224 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to a battery pack and/or corresponding electric aircraft. For instance, and without limitation, if an identified operating condition, such as a temperature of a battery cell of battery pack 200, does not fall within a predetermined threshold, such as a range of acceptable, operational temperatures of a battery cell, then a critical event element is determined by controller 236 of PMU 224. For example, and without limitation, PMU 224 may use measurement datum from MMU 220 to identify a temperature of 95° F. for a battery cell. If the predetermined temperature threshold is, for example, 75 to 90° F., then the determined operating condition is outside of the predetermined temperature threshold, such as exceeding the upper threshold of 90° F., and a critical event element is determined by controller 236. As used in this disclosure, a "predetermined threshold" is a limit and/or range of an acceptable quantitative value or representation related to a normal operating condition and/or state of a battery pack and/or components thereof. In one or more embodiments, an operating condition outside of a threshold is a critical operating condition, which triggers a critical event element. An operating condition within the threshold is a normal operating condition, which indicates that a battery pack is working properly, and no critical event element is determined. For example, and without limitation, if an operating condition of temperature exceeds a predetermined temperature threshold of a battery pack, then the battery pack is considered to be operating at a critical operating condition and may be at risk of overheating and experiencing a catastrophic failure. In one or more embodiments, critical event elements may include high shock/drop, overtemperature, undervoltage, high moisture, contactor welding, and the like.

In one or more embodiments, controller 236 of PMU 224 is configured to generate an action command if critical event element is determined by controller 236. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds a predetermined temperature threshold, then controller 236 may determine a critical event element indicating that battery pack 200 is working at a critical temperature level and at risk of catastrophic failure.

With continued reference to FIG. 2, the charger management system 100 may be configured to use a pack monitoring unit (PMU) to measure a measure a condition parameter of a component of an electric aircraft battery pack to ensure the battery pack is operating properly and to prevent or reduce damage to the electric aircraft if the battery pack experiences catastrophic failure. As used in this disclosure, a "condition parameter" is a detected electrical or physical input, characteristic, and/or phenomenon related to a state of a battery pack. For example, and without limitation, sensor may measure a condition parameter, such as temperature, of a battery module terminal and/or a battery cell of battery pack. A condition parameter may include a temperature, a voltage, a current, a pressure, a gas level, a moisture/humidity level, an orientation, or the like, of battery pack and/or a component of battery pack, such as a battery module or a battery cell.

Still referring to FIG. 2, battery management component 232 includes a high voltage disconnect 228 communicatively connected to battery module 204, wherein high voltage disconnect 228 is configured to terminate power supply connection 212 between battery module 204 and electric aircraft 208 in response to receiving an action command from PMU 224. PMU 224 may be configured to determine a critical event element, such as high shock/drop, overtemperature, undervoltage, contactor welding, and the like. High voltage disconnect 228 is configured to receive action command generated by PMU 224 and thus lock out battery pack 200 for maintenance in response to received action command. In one or more embodiments, PMU 224 may create an alert, such as a lockout flag, which may be saved across reboots. A "lockout flag" may include an indicator alerting a user of a critical event element and subsequent termination of power supply connection 212 by high voltage disconnect 228. In one or more embodiments, a lockout flag may be saved in memory component 240 of PMU 124 so that, despite rebooting battery pack 200 or complete loss of power of battery pack 200, power supply connection remains terminated and an alert regarding the termination remains. In one or more embodiments, an alert and/or lockout flag may be transmitted to a user device for viewing. For example, and without limitation, an alert may be shown on a mobile device, a laptop, a tablet, a display of an electric aircraft user interface, or the like. In one or more embodiments, lockout flag cannot be removed until a critical event element is no longer determined by controller 236. For, example, PMU 224 may be continuously updating an operating condition and determining if operating condition is outside of a predetermined threshold. In one or more embodiments, lockout flag may include an alert on a graphic user interface of, for example, a remote computing device, such as a mobile device, tablet, laptop, desktop and the like. In other embodiments, lockout flag may be indicated to a user via an illuminated LED that is remote or locally located on battery pack 200. In one or more embodiments, PMU 224 may include control of cell group balancing via MMUs, control of contactors (high voltage connections, etc.) control of welding detection, control of pyro fuses, and the like.

Referring to FIG. 1 again, the charger management system 100 includes a computing device 112. Computing device 112 may include any computing device as described in this disclosure, including without limitation a microcontroller, microprocessor, digital signal processor (DSP) and/or system on a chip (SoC) as described in this disclosure. Computing device 112 may include, be included in, and/or communicate with a mobile device such as a mobile telephone or smartphone. Computing device 112 may include a single computing device operating independently, or may include two or more computing device operating in concert, in parallel, sequentially or the like; two or more computing devices may be included together in a single computing device or in two or more computing devices. computing device 112 may interface or communicate with one or more additional devices as described below in further detail via a network interface device. Network interface device may be utilized for connecting computing device 112 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device 112 may include but is not limited to, for example, a computing device or cluster of computing devices in a first location and a second computing device or cluster of computing devices in a second location. Computing device 112 may include one or more computing devices dedicated to data storage, security, distribution of traffic for load balancing, and the like. Computing device 112 may distribute one or more computing tasks as described below across a plurality of computing devices of computing device, which may operate in parallel, in series, redundantly, or in any other manner used for distribution of tasks or memory between computing devices. Computing device 112 may be implemented using a "shared nothing" architecture in which data is cached at the worker, in an embodiment, this may enable scalability of system 100 and/or computing device.

With continued reference to FIG. 1, computing device 112 may be designed and/or configured to perform any method, method step, or sequence of method steps in any embodiment described in this disclosure, in any order and with any degree of repetition. For instance, computing device 112 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. computing device 112 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, the computing device 112 is configured to select a datum of the plurality of data and utilize the datum to determine a charger status. Charger status may be determined for any charger 104 on a network 116. As used herein, "charger status" is an element of data that represents an operating status of at least a portion of charger 104. Charger status comprises a charge time remaining estimate. Estimate is calculated using the computing device 112 and various battery metrics mentioned above. Charger status may also include, without limitation, whether the charger 104 is connected to a battery, whether the charger 104 is currently charging a battery, the state of charge, the state of health, etc.

Still referring to FIG. 1, computing device 112 is configured to determine a charge cycle as a function of a machine-learning model. "Charge cycle," for the purposes of this disclosure, refer to a process of recharging and discharging an electric energy source as required into a load which may include, but not limited to, a battery of an electric aircraft, supplemental storage unit of an electric grid, and the like. The charge cycle may be determined as a function of a machine-learning model wherein the machine-learning model may receive a set of training data including, but not limited to, rate of a charge cycle of an electric grid, rate of charge of an electric vehicle, and rate of charge of an electric vehicle recharging component, and train the set with a classification of failure modes to determine the charge cycle to recharge an electric grid when a computing device detects a failure of the electric grid. Once a charge level is set, battery charger 104 may automatically turn off and on to maintain a specified charge range.

With continued reference to FIG. 1, the computing device 112 is connected to a mesh network 116. Each computing device 112 of the plurality of computing devices connected to at least a battery charger 104 is configured to generate a node of a multi node network 116. In some embodiments, a node may be generated from a battery charger 104. A node communicates data from the computing device 112 to the charger 104.

Figure 3:
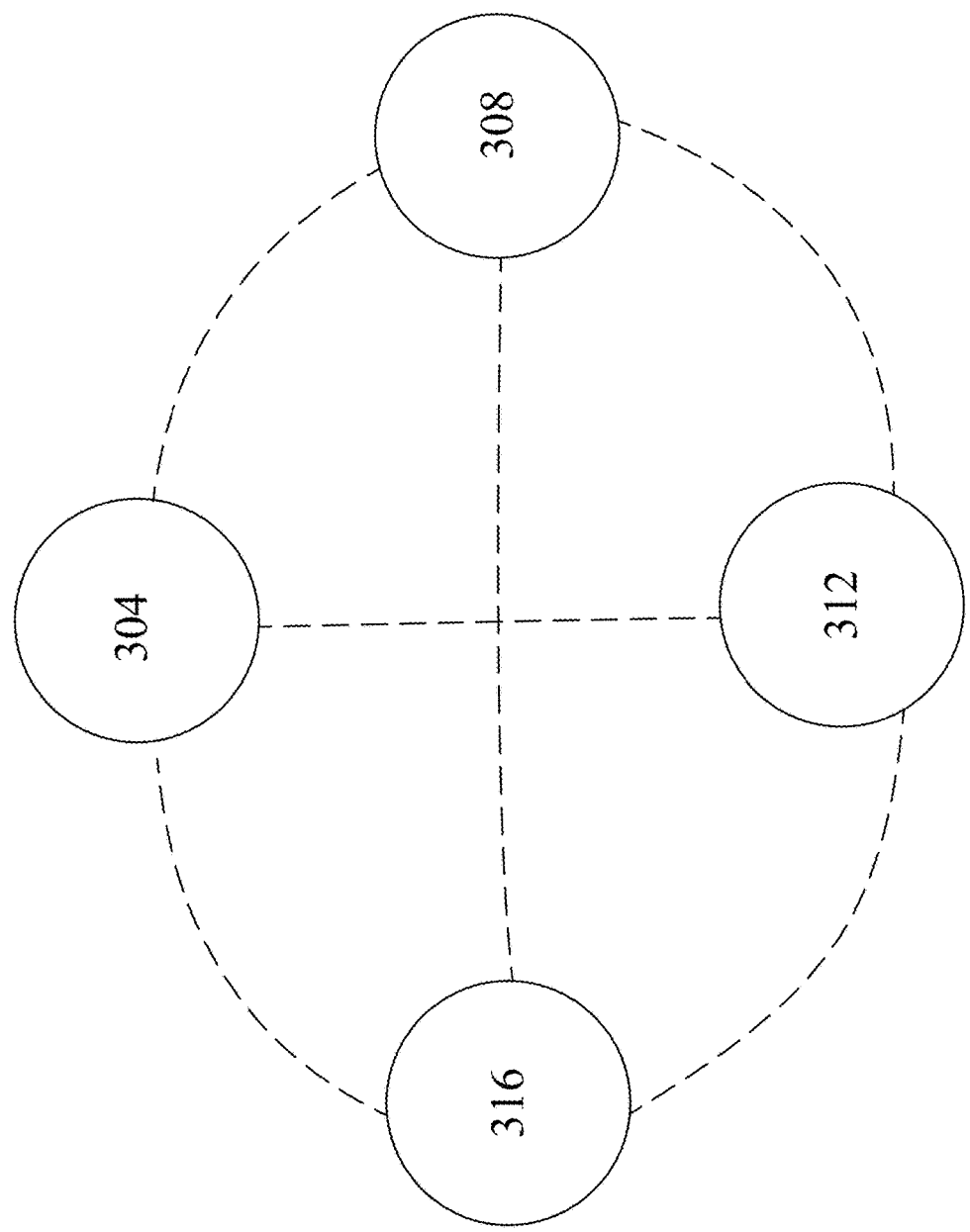
FIG. 3 is a block diagram of a system for a mesh network for an aircraft.

Now referring to FIG. 3, a block diagram of a system for a mesh network 116 for an electric aircraft. Node 304 may be designed and/or configured to perform any method, method step, or sequence of method steps in any embodiment described in this disclosure, in any order and with any degree of repetition. For instance, node 304 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Node 304 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 3, system 300 may include a plurality of nodes. In some embodiments, system 300 may include and/or communicate with a second node 308. In some embodiments, system 300 may include and/or communicate with a third node 312. In some embodiments, system 300 may include and/or communicate with a fourth node 316. A "node" as used in this disclosure is a computing device that is configured to receive and transmit data to another computing device. A node may include any computing device, such as, but not limited to, an electric aircraft, a laptop, a smartphone, a tablet, a command deck, a recharging pad, and/or other computing devices. In some embodiments, node 304 may include a computing device of a charger management system. In some embodiments, node 304, second node 308, third node 312, and fourth node 316 may include a computing device 112 of a charger management system. In some embodiments, node 304 may be configured to transmit and receive data from second node 308, third node 312, and/or fourth node 316. In some embodiments, second node 308 may be configured to transmit and receive data from node 304, third node 312, and/or fourth node 316. In some embodiments, third node 312 may be configured to transmit and receive data from node 304, second node 308, and/or fourth node 316. In some embodiments, fourth node 316 may be configured to transmit and receive data from first node 304, second node 308, and/or third node 312. System 300 may include and/or communicate with a plurality of nodes greater than four nodes. In some embodiments, system 300 may include less than four nodes. A node of system 300 may be configured to communicate data to another node of system 300. Data may include, but is not limited to, flight path data, battery charge data, locational data, speed data, acceleration data, propulsor data, power data, and/or other data. In some embodiments, data may include communication efficiency feedback. "Communication efficiency feedback," as used in this disclosure, is any data concerning effectiveness of data transmission. In some embodiments, communication efficiency feedback may include, but is not limited to, signal strength, signal-noise ratio, error rate, availability of a higher-efficiency mode, physical trajectory of a second node, project change over time, relative strength of a third node, and the like. In some embodiments, system 300 may include and/or communicate with an initial recipient node. An "initial recipient node" as used in this disclosure is any node first transmitted to in a network. In some embodiments, first node 304 may include an initial recipient node. First node 304 may transmit data to second node 308. Second node 308 may transmit communication efficiency feedback to another node of system 300. In some embodiments, communication efficiency feedback may be based on data transmission times between two or more nodes. Communication efficiency feedback may be explicit. Explicit communication efficiency feedback may include second node 308 providing information to first node 304 about transmission times, error rates, signal-noise ratios, and the like. In some embodiments, second node 308 may provide communication efficiency feedback to first node 304 about one or more other nodes in system 300. Communication efficiency feedback about one or more other nodes of system 300 may include, but is not limited to, transmission speed, signal strength, error rate, signal-noise ratio, physical trajectory, availability, projected change over time, and the like. First node 304 may use communication efficiency feedback of second node 304 and/or one or more other nodes of system 300 to select an initial recipient node. Communication efficiency feedback may alternatively or additionally be implicit. Implicit communication efficiency feedback may include first node 304 detecting communication parameters such as, but not limited to, transmission speed, error rate, signal strength, physical trajectory, signal-noise ratio, and the like. First node 304 may determine one or more communication parameters based on a transmission between first node 304 and one or more other nodes of system 300. In some embodiments, first node 304 may store communication parameters of one or more other nodes. In a non-limiting example, first node 304 may store communication parameters of second node 304 which may include that second node 304 may have a high signal-noise ratio. First node 304 may search for another node of system 300 to select as an initial recipient node based on stored communication parameters of second node 308. In some embodiments, first node 304 may compare one or more communication parameters of a communication efficiency feedback of one or more nodes to select an initial recipient node. First node 304 may compare communication efficiency feedback to a communication threshold. A "communication threshold" as used in this disclosure is any minimum or maximum value of a communication metric. A communication threshold may include, but is not limited to, an error rate, a transmission speed, a signal-noise ratio, a physical trajectory, a signal strength, and the like. In some embodiments, first node 304 may receive data from second node 308 about a third node, fourth node, etc. Data about a third node, fourth node, etc. may include communication efficiency feedback. First node 304 may use data received from second node 308 about another node to select from a plurality of nodes of system 300. First node 304 may utilize a machine-learning model to predict an optimal communication pathway of nodes. A machine-learning model may be trained on training data correlating communication parameters to selected initial recipient nodes. Training data may be obtained from prior transmissions, stored data of one or more nodes, and/or received from an external computing device. In some embodiments, training data may be obtained from a user input. First node 304 may utilize a machine-learning model to compare one or more nodes based on one or more communication parameters for an optimal pathway selection. A machine-learning model may be as described below with reference to FIG. 5.

Still referring to FIG. 3, first node 304 may generate an objective function to compare communication parameters of two or more nodes. An "objective function" as used in this disclosure is a process of maximizing or minimizing one or more values based on a set of constraints. In some embodiments, an objective function of generated by first node 304 may include an optimization criterion. An optimization criterion may include any description of a desired value or of values for one or more attributes of a communication pathway; desired value or range of values may include a maximal or minimal value, a range between maximal or minimal values, or an instruction to maximize or minimize an attribute. As a non-limiting example, an optimization criterion of at least an optimization criterion may specify that a communication should have a fast transmission time; an optimization criterion may cap error rates of a transmission. An optimization criterion may specify one or more thresholds for communication parameters in transmission pathways. An optimization criterion may specify one or more desired physical trajectories for a communication pathway. In an embodiment, at least an optimization criterion may assign weights to different attributes or values associated with attributes; weights, as used herein, may be multipliers or other scalar numbers reflecting a relative importance of a particular attribute or value. As a non-limiting example, minimization of response time may be multiplied by a first weight, while a communication threshold above a certain value may be multiplied by a second weight. Optimization criteria may be combined in weighted or unweighted combinations into a function reflecting an overall outcome desired by a user; function may be a communication function to be minimized and/or maximized. Function may be defined by reference to communication constraints and/or weighted aggregation thereof; for instance, a communication function combining optimization criteria may seek to minimize or maximize a function of communication constraints.

Still referring to FIG. 3, first node 304 may use an objective function to compare second node 304 to one or more other nodes. Generation of an objective function may include generation of a function to score and weight factors to achieve a communication score for each feasible pairing. In some embodiments, pairings may be scored in a matrix for optimization, where columns represent nodes and rows represent communications potentially paired therewith; each cell of such a matrix may represent a score of a pairing of the corresponding node to the corresponding communication. In some embodiments, assigning a predicted process that optimizes the objective function includes performing a greedy algorithm process. A "greedy algorithm" is defined as an algorithm that selects locally optimal choices, which may or may not generate a globally optimal solution. For instance, first node 304 may select pairings so that scores associated therewith are the best score for each order and/or for each process. In such an example, optimization may determine the combination of processes such that each object pairing includes the highest score possible.

Still referring to FIG. 3, an objective function may be formulated as a linear objective function. First node 304 may solve objective function 344 using a linear program such as without limitation a mixed-integer program. A "linear program," as used in this disclosure, is a program that optimizes a linear objective function, given at least a constraint. For instance, and without limitation, objective function may seek to maximize a total score $\Sigma_{r \in R} \Sigma_{s \in S} c_{rs} x_{rs}$, where R is a set of all nodes r, S is a set of all communications s, $c_{rs}$ is a score of a pairing of a given node with a given communication, and $x_{rs}$ is 3 if a node r is paired with a communication s, and 0 otherwise. Continuing the example, constraints may specify that each node is assigned to only one communication, and each communication is assigned only one node. Communications may include communications and/or transmissions as described above. Sets of communications may be optimized for a maximum score combination of all generated communications. In various embodiments, first node 304 may determine a combination of nodes that maximizes a total score subject to a constraint that all nodes are paired to exactly one communication. In some embodiments, not all communications may receive a node pairing since each communication may only use one node. In some embodiments, an objective function may be formulated as a mixed integer optimization function. A "mixed integer optimization" as used in this disclosure is a program in which some or all of the variables are restricted to be integers. A mathematical solver may be implemented to solve for the set of feasible pairings that maximizes the sum of scores across all pairings; mathematical solver may be implemented on first node 304 and/or another device in system 300, and/or may be implemented on third-party solver.

With continued reference to FIG. 3, optimizing an objective function may include minimizing a loss function, where a "loss function" is an expression an output of which an optimization algorithm minimizes to generate an optimal result. As a non-limiting example, first node 304 may assign variables relating to a set of parameters, which may correspond to a score of communications as described above, calculate an output of mathematical expression using the variables, and select a pairing that produces an output having the lowest size, according to a given definition of "size," of the set of outputs representing each of plurality of candidate ingredient combinations; size may, for instance, included absolute value, numerical size, or the like. Selection of different loss functions may result in identification of different potential pairings as generating minimal outputs. Objectives represented in an objective function and/or loss function may include minimization of response times. Objectives may include minimization of error rate of transmission. Objectives may include minimization of nodes used. Objectives may include minimization of signal-noise ratio. Objectives may include minimization of physical trajectory.

Still referring to FIG. 3, first node 304 may use a fuzzy inferential system to determine an initial recipient node. "Fuzzy inference" is the process of formulating a mapping from a given input to an output using fuzzy logic. "Fuzzy logic" is a form of many-valued logic in which the truth value of variables may be any real number between 0 and 1. Fuzzy logic may be employed to handle the concept of partial truth, where the truth value may range between completely true and completely false. The mapping of a given input to an output using fuzzy logic may provide a basis from which decisions may be made and/or patterns discerned. A first fuzzy set may be represented, without limitation, according to a first membership function representing a probability that an input falling on a first range of values is a member of the first fuzzy set, where the first membership function has values on a range of probabilities such as without limitation the interval [0,1], and an area beneath the first membership function may represent a set of values within the first fuzzy set. A first membership function may include any suitable function mapping a first range to a probability interval, including without limitation a triangular function defined by two linear elements such as line segments or planes that intersect at or below the top of the probability interval.

Still referring to FIG. 3, a first fuzzy set may represent any value or combination of values as described above, including communication parameters. A second fuzzy set, which may represent any value which may be represented by first fuzzy set, may be defined by a second membership function on a second range; second range may be identical and/or overlap with first range and/or may be combined with first range via Cartesian product or the like to generate a mapping permitting evaluation overlap of first fuzzy set and second fuzzy set. Where first fuzzy set and second fuzzy set have a region that overlaps, first membership function and second membership function may intersect at a point representing a probability, as defined on probability interval, of a match between first fuzzy set and second fuzzy set. Alternatively or additionally, a single value of first and/or second fuzzy set may be located at a locus on a first range and/or a second range, where a probability of membership may be taken by evaluation of a first membership function and/or a second membership function at that range point. A probability may be compared to a threshold to determine whether a positive match is indicated. A threshold may, in a non-limiting example, represent a degree of match between a first fuzzy set and a second fuzzy set, and/or single values therein with each other or with either set, which is sufficient for purposes of the matching process. In some embodiments, there may be multiple thresholds. Each threshold may be established by one or more user inputs. Alternatively or additionally, each threshold may be tuned by a machine-learning and/or statistical process, for instance and without limitation as described in further detail below.

Still referring to FIG. 3, first node 304 may use a fuzzy inference system to determine a plurality of outputs based on a plurality of inputs. A plurality of outputs may include a communication efficiency of one or more nodes. A plurality of inputs may include communication efficiency feedback as described above. In a non-limiting example, first node 304 may detect that second node 308 may have slow response time and a far physical trajectory. First node 304 may determine, using fuzzy logic, that second node 308 is "too far" for selection as an initial recipient node. In another non-limiting example, first node 304 may detect that second node 308 may have a high transmission speed and a close physical trajectory. First node 304 may determine that second node 308 has a "strong signal".

Still referring to FIG. 3, first node 304 may determine a connectivity of a plurality of potential initial recipient nodes. First node 304 may determine, using any process described in this disclosure, an optimal initial recipient node according to a selection criteria. A selection criteria may include, but is not limited to, physical trajectory, projected change over time, signal strength, error rate, transmission speeds, response times, neighboring nodes, and the like. In some embodiments, each node of system 300 may iteratively ID initial recipient nodes and calculate a best option score and an average score. Each node may send a best option score and/or an average score to all nodes of system 300. A node of system 300 may calculi and update a best option score and/or an average score based on data received from other nodes of system 300. In some embodiments, by having each node update a best option score and average score of their own initial recipient nodes, first node 304 may select an initial recipient node based on robustness and speed of each possible pathway of other nodes of system 300.

In some embodiments, and continuing to refer to FIG. 3, node 304 may be generated from a flight controller of an aircraft. In some embodiments, all nodes of system 300 may be generated from a flight controller of an aircraft. In some embodiments, one node of system 300 may be generated from an aircraft and another node may be generated from a landing pad and/or recharging station. In some embodiments, a node 304 may be generated from an electric aircraft and may communicate charging data to node 308 which may be generated from a charging infrastructure. An electric aircraft may communicate with a charging infrastructure through one or more nodes of system 300. Communication between an electric aircraft and a charging infrastructure may include, but is not limited to, data communication about charge status of an electric aircraft, charging standards of an electric aircraft, charging compatibility of the charger 104 and the electric aircraft, estimated charging times, and the like.

Still referring to FIG. 3, in some embodiments, system 300 may include, participate in, and/or be incorporated in a network topology. A "network topology" as used in this disclosure is an arrangement of elements of a communication network. In some embodiments, system 300 may include, but is not limited to, a star network, tree network, and/or a mesh network. A "mesh network" as used in this disclosure is a local network topology in which the infrastructure nodes connect directly, dynamically, and non-hierarchically to as many other nodes as possible. Nodes of system 300 may be configured to communicate in a partial mesh network. A partial mesh network may include a communication system in which some nodes may be connected directly to one another while other nodes may need to connect to at least another node to reach a third node. In some embodiments, system 300 may be configured to communicate in a full mesh network. A full mesh network may include a communication system in which every node in the network may communicate directly to one another. In some embodiments, system 300 may include a layered data network. As used in this disclosure a "layered data network" is a data network with a plurality of substantially independent communication layers with each configured to allow for data transfer over predetermined bandwidths and frequencies. As used in this disclosure a "layer" is a distinct and independent functional and procedural tool of transferring data from one location to another. For example, and without limitation, one layer may transmit communication data at a particular frequency range while another layer may transmit communication data at another frequency range such that there is substantially no cross-talk between the two layers which advantageously provides a redundancy and safeguard in the event of a disruption in the operation of one of the layers. A layer may be an abstraction which is not tangible.

Still referring to FIG. 3, in some embodiments, system 300 may include node 304, second node 308, third node 332, and/or fourth node 336. Node 304 may be configured to communicate with a first layer providing radio communication between nodes at a first bandwidth. In some embodiments, node 304 may be configured to communicate with a second layer providing mobile network communication between the nodes at a second bandwidth. In some embodiments, node 304 may be configured to communicate with a third layer providing satellite communication between the nodes at a third bandwidth. In some embodiments, any node of system 300 may be configured to communicate with any layer of communication. In some embodiments, a node of system 300 may include an antenna configured to provide radio communication between one or more nodes. For example, and without limitation, an antenna may include a directional antenna. In an embodiment, system 300 may include a first bandwidth, a second bandwidth, and a third bandwidth. In some embodiments, system 300 may include more or less than three bandwidths. In some embodiments, a first bandwidth may be greater than a second bandwidth and a third bandwidth. In some embodiments, system 300 may be configured to provide mobile network communication in the form a cellular network, such as, but not limited to, 2G, 3G, 4G, 5G, LTE, and/or other cellular network standards.

Still referring to FIG. 3, radio communication, in accordance with embodiments, may utilize at least a communication band and communication protocols suitable for aircraft radio communication. For example, and without limitation, a very-high-frequency (VHF) air band with frequencies between about 108 MHz and about 137 MHz may be utilized for radio communication. In another example, and without limitation, frequencies in the Gigahertz range may be utilized. Airband or aircraft band is the name for a group of frequencies in the VHF radio spectrum allocated to radio communication in civil aviation, sometimes also referred to as VHF, or phonetically as "Victor". Different sections of the band are used for radio-navigational aids and air traffic control. Radio communication protocols for aircraft are typically governed by the regulations of the Federal Aviation Authority (FAA) in the United States and by other regulatory authorities internationally. Radio communication protocols may employ, for example and without limitation an S band with frequencies in the range from about 2 GHz to about 4 GHz. For example, and without limitation, for 4G mobile network communication frequency bands in the range of about 2 GHz to about 8 GHz may be utilized, and for 5G mobile network communication frequency bands in the ranges of about 450 MHz to about 6 GHz and of about 24 GHz to about 53 GHz may be utilized. Mobile network communication may utilize, for example and without limitation, a mobile network protocol that allows users to move from one network to another with the same IP address. In some embodiments, a node of system 300 may be configured to transmit and/or receive a radio frequency transmission signal. A "radio frequency transmission signal," as used in this disclosure, is an alternating electric current or voltage or of a magnetic, electric, or electromagnetic field or mechanical system in the frequency range from approximately 20 kHz to approximately 300 GHz. A radio frequency (RF) transmission signal may compose an analogue and/or digital signal received and be transmitted using functionality of output power of radio frequency from a transmitter to an antenna, and/or any RF receiver. A RF transmission signal may use longwave transmitter device for transmission of signals. An RF transmission signal may include a variety of frequency ranges, wavelength ranges, ITU designations, and IEEE bands including HF, VHF, UHF, L, S, C, X, Ku, K, Ka, V, W, mm, among others.

Still referring to FIG. 3, satellite communication, in accordance with embodiments, may utilize at least a communication band and communication protocols suitable for aircraft satellite communication. For example, and without limitation, satellite communication bands may include L-band (1-2 GHz), C-band (4-8 GHz), X-band (8-12 GHz), Ku-band (12-18 GHz), Ku-band (12-18 GHz), and the like, among others. Satellite communication protocols may employ, for example and without limitation, a Secondary Surveillance Radar (SSR) system, automated dependent surveillance-broadcast (ADS-B) system, or the like. In SSR, radar stations may use radar to interrogate transponders attached to or contained in aircraft and receive information in response describing such information as aircraft identity, codes describing flight plans, codes describing destination, and the like SSR may utilize any suitable interrogation mode, including Mode S interrogation for generalized information. ADS-B may implement two communication protocols, ADS-B-Out and ADS-B-In. ADS-B-Out may transmit aircraft position and ADS-B-In may receive aircraft position. Radio communication equipment may include any equipment suitable to carry on communication via electromagnetic waves at a particular bandwidth or bandwidth range, for example and without limitation, a receiver, a transmitter, a transceiver, an antenna, an aerial, and the like, among others. A mobile or cellular network communication equipment may include any equipment suitable to carry on communication via electromagnetic waves at a particular bandwidth or bandwidth range, for example and without limitation, a cellular phone, a smart phone, a personal digital assistant (PDA), a tablet, an antenna, an aerial, and the like, among others. A satellite communication equipment may include any equipment suitable to carry on communication via electromagnetic waves at a particular bandwidth or bandwidth range, for example and without limitation, a satellite data unit, an amplifier, an antenna, an aerial, and the like, among others.

Still referring to FIG. 3, as used in this disclosure "bandwidth" is measured as the amount of data that can be transferred from one point or location to another in a specific amount of time. The points or locations may be within a given network. Typically, bandwidth is expressed as a bitrate and measured in bits per second (bps). In some instances, bandwidth may also indicate a range within a band of wavelengths, frequencies, or energies, for example and without limitation, a range of radio frequencies which is utilized for a particular communication.

Still referring to FIG. 3, as used in this disclosure "antenna" is a rod, wire, aerial or other device used to transmit or receive signals such as, without limitation, radio signals and the like. A "directional antenna" or beam antenna is an antenna which radiates or receives greater power in specific directions allowing increased performance and reduced interference from unwanted sources. Typical examples of directional antennas include the Yagi antenna, the log-periodic antenna, and the corner reflector antenna. The directional antenna may include a high-gain antenna (HGA) which is a directional antenna with a focused, narrow radio wave beamwidth and a low-gain antenna (LGA) which is an omnidirectional antenna with a broad radio wave beamwidth, as needed or desired.

With continued reference to FIG. 3, as used in this disclosure, a "signal" is any intelligible representation of data, for example from one device to another. A signal may include an optical signal, a hydraulic signal, a pneumatic signal, a mechanical, signal, an electric signal, a digital signal, an analog signal and the like. In some cases, a signal may be used to communicate with a computing device, for example by way of one or more ports. In some cases, a signal may be transmitted and/or received by a computing device for example by way of an input/output port. An analog signal may be digitized, for example by way of an analog to digital converter. In some cases, an analog signal may be processed, for example by way of any analog signal processing steps described in this disclosure, prior to digitization. In some cases, a digital signal may be used to communicate between two or more devices, including without limitation computing devices. In some cases, a digital signal may be communicated by way of one or more communication protocols, including without limitation internet protocol (IP), controller area network (CAN) protocols, serial communication protocols (e.g., universal asynchronous receiver-transmitter [UART]), parallel communication protocols (e.g., IEEE 128 [printer port]), and the like.

Still referring to FIG. 3, in some cases, a node of system 300 may perform one or more signal processing steps on a sensed characteristic. For instance, a node may analyze, modify, and/or synthesize a signal representative of characteristic in order to improve the signal, for instance by improving transmission, storage efficiency, or signal to noise ratio. Exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which varying continuously within a domain, for instance time. Exemplary non-limiting continuous time processes may include time domain processing, frequency domain processing (Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point and floating-point, real-valued and complex-valued, multiplication and addition. Digital signal processing may additionally operate circular buffers and lookup tables. Further non-limiting examples of algorithms that may be performed according to digital signal processing techniques include fast Fourier transform (FFT), finite impulse response (FIR) filter, infinite impulse response (IIR) filter, and adaptive filters such as the Wiener and Kalman filters. Statistical signal processing may be used to process a signal as a random function (i.e., a stochastic process), utilizing statistical properties. For instance, in some embodiments, a signal may be modeled with a probability distribution indicating noise, which then may be used to reduce noise in a processed signal. Additional disclosure related to a pack monitoring system can be found in U.S. patent application Ser. No. 17/478,067 entitled "SYSTEM FOR MESH NETWORK FOR USE IN AIRCRAFTS", entirety of which incorporated herein by reference.

Figure 4:
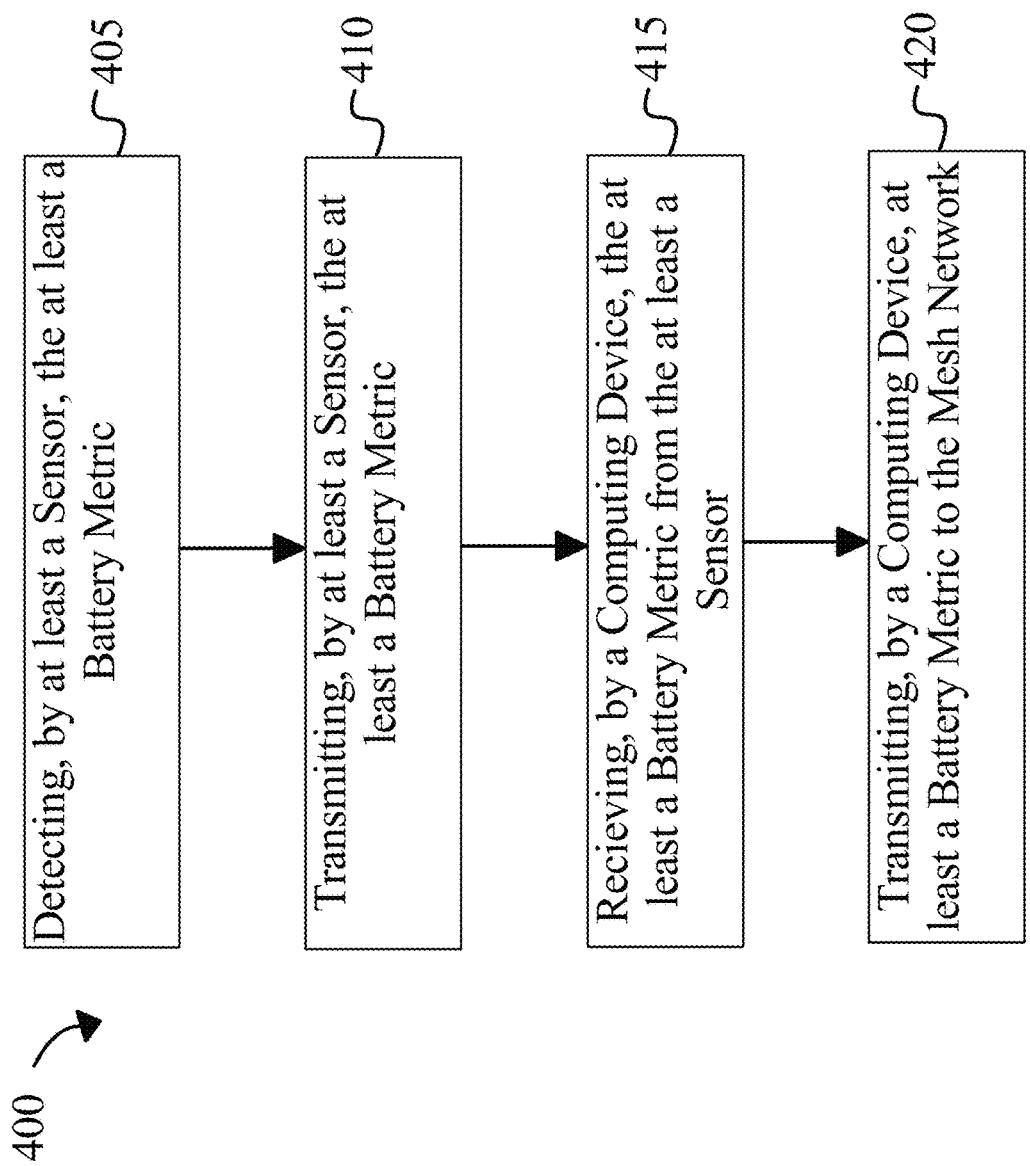
FIG. 4 is a process flow diagram illustrating the method of charger management.

Now referring to FIG. 4, process flow diagram illustrating the method 400 of charger management. At step 405, at least a battery metric is detected by at least a sensor. This may be implemented, without limitations, as described above in reference to FIG. 1-4.

At step 410, and still referring to FIG. 4, the at least a battery metric is transmitted by at least a sensor. Sensor may be located within the battery pack in an MMU. This may be implemented, without limitations, as described above in reference to FIG. 1-4.

At step 415, and still referring to FIG. 4, the at least a battery metric from the at least a sensor is received by a computing device. Battery metric may be transmitted by the PMU to the computing device. Computing device may be located on the charger. This may be implemented, without limitations, as described above in reference to FIG. 1-4.

At step 420, and still referring to FIG. 4, the at least a battery metric is transmitted by a computing device to the mesh network of communicatively connected chargers. Chargers may be in the same location or in many locations. This may be implemented, without limitations, as described above in reference to FIG. 1-4.

Figure 5:
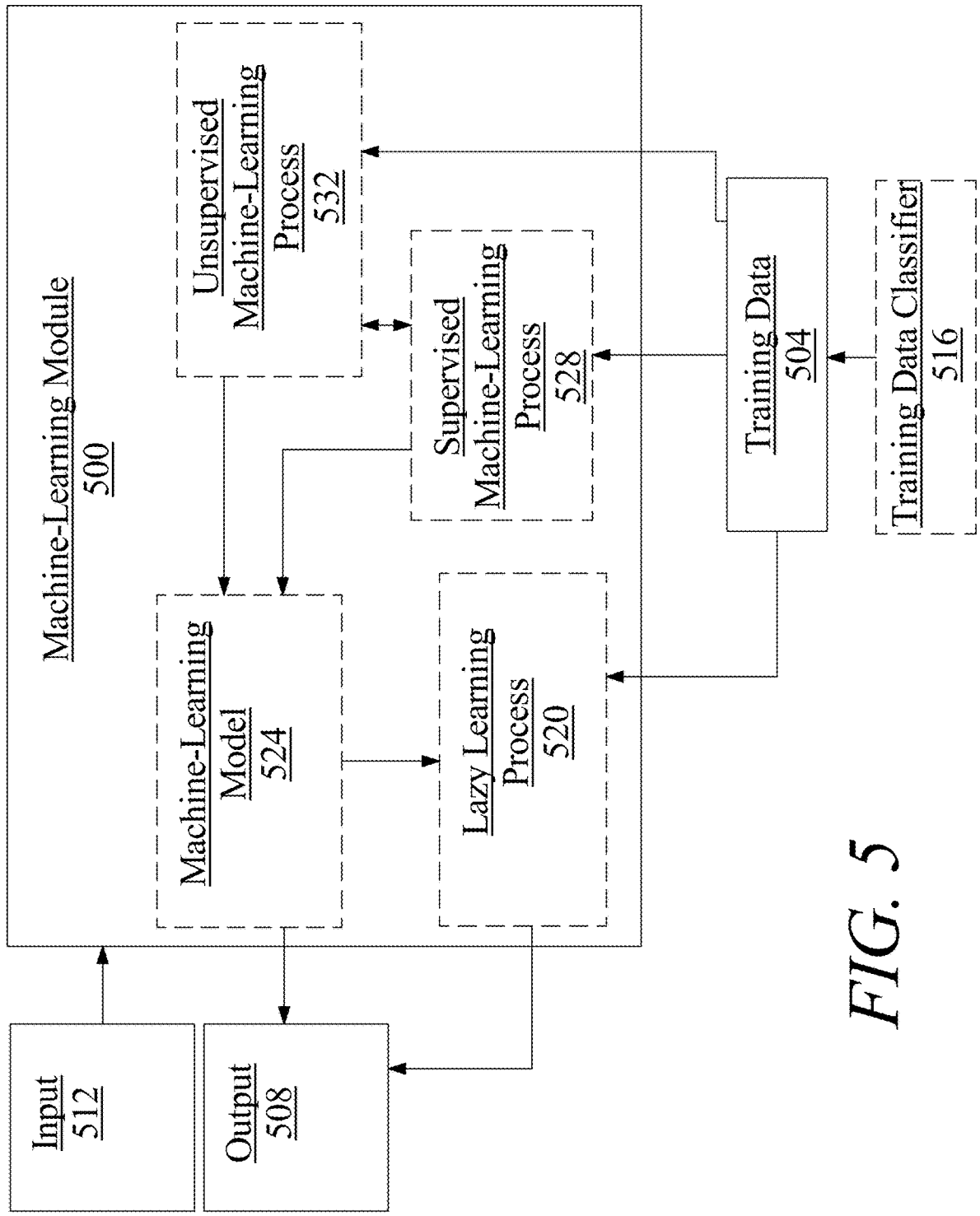
FIG. 5 is an exemplary representation of a machine learning module.

Referring now to FIG. 5, an exemplary embodiment of a machine-learning module 500 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 504 to generate an algorithm that will be performed by a computing device/module to produce outputs 508 given data provided as inputs 512; this is in contrast to a non-machine learning software program where the commands to be executed are determined in advance by a user and written in a programming language.

Still referring to FIG. 5, "training data," as used herein, is data containing correlations that a machine-learning process may use to model relationships between two or more categories of data elements. For instance, and without limitation, training data 504 may include a plurality of data entries, each entry representing a set of data elements that were recorded, received, and/or generated together; data elements may be correlated by shared existence in a given data entry, by proximity in a given data entry, or the like. Multiple data entries in training data 504 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 504 according to various correlations; correlations may indicate causative and/or predictive links between categories of data elements, which may be modeled as relationships such as mathematical relationships by machine-learning processes as described in further detail below. Training data 504 may be formatted and/or organized by categories of data elements, for instance by associating data elements with one or more descriptors corresponding to categories of data elements. As a non-limiting example, training data 504 may include data entered in standardized forms by persons or processes, such that entry of a given data element in a given field in a form may be mapped to one or more descriptors of categories. Elements in training data 504 may be linked to descriptors of categories by tags, tokens, or other data elements; for instance, and without limitation, training data 504 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 5, training data 504 may include one or more elements that are not categorized; that is, training data 504 may not be formatted or contain descriptors for some elements of data. Machine-learning algorithms and/or other processes may sort training data 504 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 504 to be made applicable for two or more distinct machine-learning algorithms as described in further detail below. Training data 504 used by machine-learning module 500 may correlate any input data as described in this disclosure to any output data as described in this disclosure. As a non-limiting illustrative example flight elements and/or pilot signals may be inputs, wherein an output may be an autonomous function.

Further referring to FIG. 5, training data may be filtered, sorted, and/or selected using one or more supervised and/or unsupervised machine-learning processes and/or models as described in further detail below; such models may include without limitation a training data classifier 516. Training data classifier 516 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 500 may generate a classifier using a classification algorithm, defined as a processes whereby a computing device and/or any module and/or component operating thereon derives a classifier from training data 504. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to sub-categories of flight elements such as torques, forces, thrusts, directions, and the like thereof.

Still referring to FIG. 5, machine-learning module 500 may be configured to perform a lazy-learning process 520 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 504. Heuristic may include selecting some number of highest-ranking associations and/or training data 504 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 5, machine-learning processes as described in this disclosure may be used to generate machine-learning models 524. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 524 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 524 may be generated by creating an artificial neural network, such as a convolutional neural network comprising an input layer of nodes, one or more intermediate layers, and an output layer of nodes. Connections between nodes may be created via the process of "training" the network, in which elements from a training data 504 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 5, machine-learning algorithms may include at least a supervised machine-learning process 528. At least a supervised machine-learning process 528, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include flight elements and/or pilot signals as described above as inputs, autonomous functions as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 504. Persons skilled in the art, upon reviewing the entirety of this disclosure, will be aware of various possible variations of at least a supervised machine-learning process 528 that may be used to determine relation between inputs and outputs. Supervised machine-learning processes may include classification algorithms as defined above.

Further referring to FIG. 5, machine learning processes may include at least an unsupervised machine-learning processes 532. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 5, machine-learning module 500 may be designed and configured to create a machine-learning model 524 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 5, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 6:
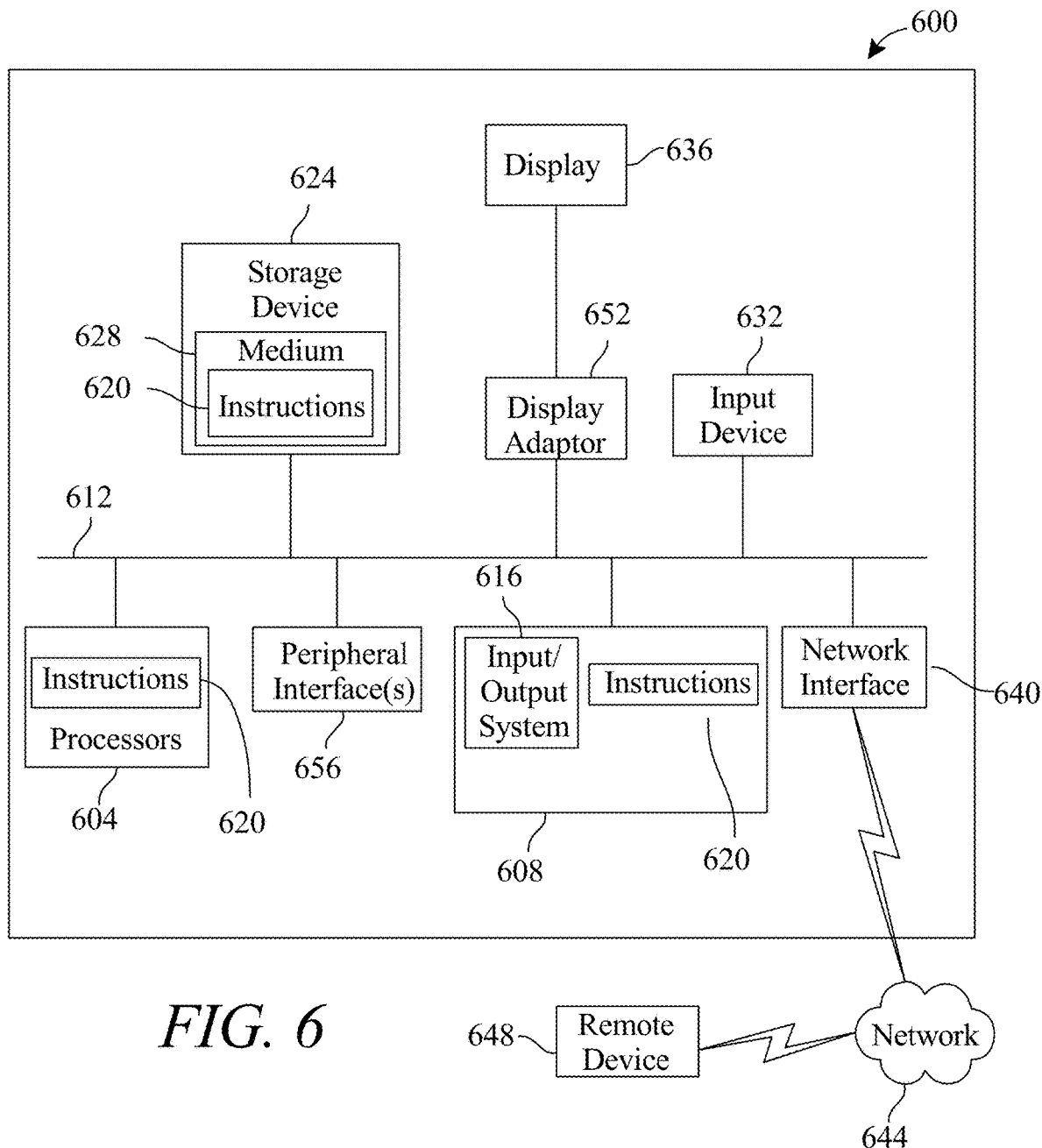
FIG. 6 is a block diagram of a computing system that can be used to implement any one or more of the methodologies disclosed herein and any one or more portions thereof.

FIG. 6 shows a diagrammatic representation of one embodiment of a computing device in the exemplary form of a computer system 600 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 600 includes a processor 604 and a memory 608 that communicate with each other, and with other components, via a bus 612. Bus 612 may include any of several types of bus structures including, but not limited to, a memory bus, a memory controller, a peripheral bus, a local bus, and any combinations thereof, using any of a variety of bus architectures.

Processor 604 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 604 may be organized according to Von Neumann and/or Harvard architecture as a non-limiting example. Processor 604 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 608 may include various components (e.g., machine-readable media) including, but not limited to, a random-access memory component, a read only component, and any combinations thereof. In one example, a basic input/output system 616 (BIOS), including basic routines that help to transfer information between elements within computer system 600, such as during start-up, may be stored in memory 608. Memory 608 may also include (e.g., stored on one or more machine-readable media) instructions (e.g., software) 620 embodying any one or more of the aspects and/or methodologies of the present disclosure. In another example, memory 608 may further include any number of program modules including, but not limited to, an operating system, one or more application programs, other program modules, program data, and any combinations thereof.

Computer system 600 may also include a storage device 624. Examples of a storage device (e.g., storage device 624) include, but are not limited to, a hard disk drive, a magnetic disk drive, an optical disc drive in combination with an optical medium, a solid-state memory device, and any combinations thereof. Storage device 624 may be connected to bus 612 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 624 (or one or more components thereof) may be removably interfaced with computer system 600 (e.g., via an external port connector (not shown)). Particularly, storage device 624 and an associated machine-readable medium 628 may provide nonvolatile and/or volatile storage of machine-readable instructions, data structures, program modules, and/or other data for computer system 600. In one example, software 620 may reside, completely or partially, within machine-readable medium 628. In another example, software 620 may reside, completely or partially, within processor 604.

Computer system 600 may also include an input device 632. In one example, a user of computer system 600 may enter commands and/or other information into computer system 600 via input device 632. Examples of an input device 632 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 632 may be interfaced to bus 612 via any of a variety of interfaces (not shown) including, but not limited to, a serial interface, a parallel interface, a game port, a USB interface, a FIREWIRE interface, a direct interface to bus 612, and any combinations thereof. Input device 632 may include a touch screen interface that may be a part of or separate from display 636, discussed further below. Input device 632 may be utilized as a user selection device for selecting one or more graphical representations in a graphical interface as described above.

A user may also input commands and/or other information to computer system 600 via storage device 624 (e.g., a removable disk drive, a flash drive, etc.) and/or network interface device 640. A network interface device, such as network interface device 640, may be utilized for connecting computer system 600 to one or more of a variety of networks, such as network 644, and one or more remote devices 648 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 644, may employ a wired and/or a wireless mode of communication. In general, any network topology may be used. Information (e.g., data, software 620, etc.) may be communicated to and/or from computer system 600 via network interface device 640.

Computer system 600 may further include a video display adapter 652 for communicating a displayable image to a display device, such as display device 636. Examples of a display device include, but are not limited to, a liquid crystal display (LCD), a cathode ray tube (CRT), a plasma display, a light emitting diode (LED) display, and any combinations thereof. Display adapter 652 and display device 636 may be utilized in combination with processor 604 to provide graphical representations of aspects of the present disclosure. In addition to a display device, computer system 600 may include one or more other peripheral output devices including, but not limited to, an audio speaker, a printer, and any combinations thereof. Such peripheral output devices may be connected to bus 612 via a peripheral interface 656. Examples of a peripheral interface include, but are not limited to, a serial port, a USB connection, a FIREWIRE connection, a parallel connection, and any combinations thereo.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for managing chargers for electric vertical takeoff and landing aircrafts, the system comprising:
    a first battery charger;
    at least a sensor incorporated with the first charger, wherein the at least a sensor comprises at least a gas sensor, the at least a sensor configured to:
        detect at least a battery metric, wherein the at least a battery metric includes charger status; and
        detect a battery health parameter, wherein detecting the battery health parameter comprises detecting at least a cell failure as a function of the at least a gas sensor;
    a computing device communicatively connected to the first battery charger and a mesh network including at least a second battery charger, the computing device configured to:
        receive the at least a battery metric and the at least a battery health parameter from the at least a sensor;
        transmit data packets to the mesh network;
        receive communication feedback from at least a node in the mesh network;
        select an initial node in the mesh network as a function of the communication feedback; and
        transmit the at least a battery metric and the at least a battery health parameter to the initial node in the mesh network.

2. The system of claim 1, wherein a battery charger is configured to support bidirectional charging.

3. The system of claim 1, wherein the at least a sensor is configured to detect an electrical parameter.

4. The system of claim 1, wherein the at least a sensor is configured to detect non-gaseous byproducts of cell failure.

5. The system of claim 1, wherein a battery charger is a trickle charger.

6. The system of claim 1, wherein the at least a sensor comprises a sensor suite, the sensor suite configured to capture a plurality of data.

7. The system of claim 1, wherein the computing device is configured to select a datum of a plurality of data and utilize the datum to determine a charger status.

8. The system of claim 7, wherein the charger status comprises a charge time remaining estimate.

9. The system of claim 1, wherein, the computing device is configured to determine a charge cycle as a function of a machine-learning model.

10. The system of claim 1, wherein the network includes one or more aircrafts.

11. A method for managing chargers for electric vertical takeoff and landing aircrafts, the method comprising:
    detecting, by at least a sensor, at least a battery metric;
    detecting, by at least a gas sensor, at least a battery health parameter;
    transmitting, by at least a sensor, at least a battery metric to a computing device;
    transmitting, by at least a gas sensor, at least a battery health metric to the computing device, wherein the battery health parameter comprises of at least cell failure detection;
    receiving, by the computing device, the at least a battery metric and the at least a battery health parameter from the at least a sensor;
    transmitting, by the computing device, data packets to the mesh network;
    receiving, by the computing device, communication feedback from at least a node in the mesh network;
    selecting, by the computing device, an initial node in the mesh network as a function of the communication feedback; and
    transmitting, by a computing device, at least a battery metric and at least a battery health parameter to the initial node in the mesh network of communicatively connected chargers.

12. The system of claim 11, wherein a battery charger is configured to support bidirectional charging.

13. The system of claim 11, wherein the at least a sensor is configured to detect an electrical parameter.

14. The system of claim 11, wherein the at least a sensor is configured to detect non-gaseous byproducts of cell failure.

15. The system of claim 11, wherein a battery charger is a trickle charger.

16. The system of claim 11, wherein the at least a sensor comprises a sensor suite, the sensor suite configured to capture a plurality of data.

17. The system of claim 11, wherein the computing device is configured to select a datum of a plurality of data and utilize the datum to determine a charger status.

18. The system of claim 17, wherein the charger status comprises a charge time remaining estimate.

19. The system of claim 11, further comprising determining, a rate of charge as a function of a machine-learning model.

20. The system of claim 11, wherein the network includes one or more aircrafts.

* * * * *